US012751171B2

(12) United States Patent
Liu et al.

(10) Patent No.: US 12,751,171 B2
(45) Date of Patent: Sep. 29, 2026

(54) DISPLAY SUBSTRATE, MANUFACTURING METHOD, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Ning Liu, Beijing (CN); Bin Zhou, Beijing (CN); Ce Zhao, Beijing (CN); Liangchen Yan, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 576 days.

(21) Appl. No.: 18/273,139

(22) PCT Filed: Aug. 30, 2022

(86) PCT No.: PCT/CN2022/115778
§ 371 (c)(1),
(2) Date: Jul. 19, 2023

(87) PCT Pub. No.: WO2024/044948
PCT Pub. Date: Mar. 7, 2024

(65) Prior Publication Data
US 2024/0395827 A1 Nov. 28, 2024

(51) Int. Cl.
*H10K 59/131* (2023.01)
*H10D 86/40* (2025.01)
*H10K 59/124* (2023.01)

(52) U.S. Cl.
CPC ....... *H10K 59/1315* (2023.02); *H10D 86/441* (2025.01); *H10K 59/124* (2023.02)

(58) Field of Classification Search
CPC . H10K 59/1315; H10K 59/124; H10D 86/441
See application file for complete search history.

(56) References Cited

U.S. PATENT DOCUMENTS

2016/0043341 A1 2/2016 Heo et al.
2017/0278910 A1 9/2017 Choi et al.
(Continued)

FOREIGN PATENT DOCUMENTS

CN 107230692 A 10/2017
CN 113629121 A 11/2021
(Continued)

*Primary Examiner* — Peter M Albrecht
(74) *Attorney, Agent, or Firm* — WHDA, LLP

(57) ABSTRACT

The present disclosure provides a display substrate, a manufacturing method and a display device. The display substrate includes a base substrate, a driving circuit layer and a light-emitting unit. The driving circuit layer includes a source/drain metal layer, the source/drain metal layer includes a source electrode, a drain electrode and an auxiliary electrode, the light-emitting unit includes a first electrode structure, a light-emitting layer and a second electrode structure, the display substrate further includes an auxiliary connection structure and a protection hole, an orthogonal projection of the auxiliary connection structure onto the base substrate is located within an orthogonal projection of the protection hole onto the base substrate, and a distance between a surface of the auxiliary connection structure away from the base substrate and the base substrate is less than a distance between a surface of the planarization layer away from the base substrate and the base substrate.

13 Claims, 4 Drawing Sheets

(56) References Cited

U.S. PATENT DOCUMENTS

| | | | | |
|---|---|---|---|---|
| 2021/0376283 | A1 | 12/2021 | Shin et al. | |
| 2023/0077299 | A1* | 3/2023 | Lee .................... | H10K 59/1315 |

FOREIGN PATENT DOCUMENTS

| | | | |
|---|---|---|---|
| CN | 113725266 | A | 11/2021 |
| CN | 114122296 | A | 3/2022 |

* cited by examiner

DISPLAY SUBSTRATE, MANUFACTURING METHOD, AND DISPLAY DEVICE

CROSS-REFERENCE TO RELATED APPLICATION

The present application is the U.S. national phase of PCT Application No. PCT/CN2022/115778 filed on Aug. 30, 2022, which is incorporated herein by reference in its entirety.

TECHNICAL FIELD

The present disclosure relate to the field of display technology, in particular to a display substrate, a manufacturing method thereof, and a display device.

BACKGROUND

Due to such advantages as clear image and vivid display effect, transparent display products have been applied to the exhibition in vehicles such as automobiles and subways, as well as exhibition in shop window. In order to improve a transparency effect, a cathode of a large-size transparent display product is provided with a very small thickness, leading to a large IR drop. In the related art, usually the cathode is lapped onto an auxiliary cathode so as to reduce the IR drop.

SUMMARY

An object of the present disclosure is to provide a display substrate, a manufacturing thereof, and a display device, so as to solve the above-mentioned problem.

In one aspect, the present disclosure provides in some embodiments a display substrate, including a base substrate, a driving circuit layer arranged on the base substrate, and a light-emitting unit arranged at a side of the driving circuit layer away from the base substrate. The driving circuit layer includes a source/drain metal layer, the source/drain metal layer includes a source electrode, a drain electrode and an auxiliary electrode, the light-emitting unit includes a first electrode structure, a light-emitting layer and a second electrode structure laminated one on another in a direction away from the base substrate, the first electrode structure is electrically coupled to the source electrode and the drain electrode, the second electrode structure is electrically coupled to the auxiliary electrode, and the display substrate further includes an auxiliary connection structure arranged at a same layer, and made of a same material, as the first electrode structure. A protection layer and a planarization layer are laminated one on another in a direction away from the base substrate between the driving circuit layer and the light-emitting unit, the display substrate further includes a protection hole formed in the planarization layer at a side away from the base substrate and penetrating through at least a part of the planarization layer, an orthogonal projection of the auxiliary connection structure onto the base substrate is located within an orthogonal projection of the protection hole onto the base substrate, and a distance between a surface of the auxiliary connection structure away from the base substrate and the base substrate is less than a distance between a surface of the planarization layer away from the base substrate and the base substrate.

In a possible embodiment of the present disclosure, the distance between the surface of the auxiliary connection structure away from the base substrate and the base substrate is less than the distance between the surface of the planarization layer away from the base substrate and the base substrate.

In a possible embodiment of the present disclosure, a distance between the surface of the auxiliary connection structure away from the base substrate and the surface of the planarization layer away from the base substrate is greater than a half of a thickness of the planarization layer.

In a possible embodiment of the present disclosure, in a direction perpendicular to the base substrate, a thickness of the auxiliary connection structure is less than the thickness of the planarization layer.

In a possible embodiment of the present disclosure, the planarization layer has a thickness greater than 2100 nm, the auxiliary connection structure has a thickness of 600 nm to 800 nm, and the distance between the surface of the auxiliary connection structure away from the base substrate and the surface of the planarization layer away from the base substrate is greater than 1400 nm.

In a possible embodiment of the present disclosure, the distance between the surface of the auxiliary connection structure away from the base substrate and the base substrate is smaller than a distance between the base substrate and a surface of the second electrode structure in a light-emitting region of the display substrate close to the base substrate.

In a possible embodiment of the present disclosure, the protection hole extends through the planarization layer and the protection layer, and an orthogonal projection of the protection hole onto the base substrate covers an orthogonal projection of the auxiliary electrode onto the base substrate.

In a possible embodiment of the present disclosure, the surface of the auxiliary electrode away from the base substrate is in contact with a surface of the auxiliary connection structure close to the base substrate.

In a possible embodiment of the present disclosure, the auxiliary connection structure includes a first sub-electrode layer, a reflection sub-layer and a second sub-electrode layer laminated one on another in a direction away from the base substrate, an orthogonal projection of the first sub-electrode layer onto the base substrate is greater than an orthogonal projection of the reflection sub-layer onto the base substrate, and an orthogonal projection of the second sub-electrode layer onto the base substrate is greater than an orthogonal projection of the reflection sub-layer onto the base substrate.

In a possible embodiment of the present disclosure, a first distance difference of the display substrate is greater than a thickness of a suspension part of the auxiliary connection structure, the first distance difference is a difference between the distance between the surface of the auxiliary connection structure away from the base substrate and the base substrate and a distance between a surface of the first electrode structure away from the base substrate and the base substrate, and the suspension part of the auxiliary connection structure includes the second sub-electrode layer.

In a possible embodiment of the present disclosure, the suspension part has a thickness greater than the second electrode structure in a direction perpendicular to the base substrate.

In another aspect, the present disclosure provides in some embodiments a display device including the above-mentioned display substrate.

In yet another aspect, the present disclosure provides in some embodiments a method for manufacturing a display substrate, including: providing a base substrate: forming a driving circuit layer on the base substrate, the driving circuit layer including a source/drain metal layer, and the source/drain metal layer including a source electrode, a drain electrode and an auxiliary electrode: forming a protection layer and a planarization layer in sequence on the driving circuit layer: forming a protection hole in the planarization layer at a side away from the base substrate, the protection hole penetrating through at least part of the planarization layer: forming a first electrode structure and an auxiliary connection structure through a single patterning process, the first electrode structure being electrically coupled to the source electrode and the drain electrode, an orthogonal projection of the auxiliary connection structure onto the base substrate being located within an orthogonal projection of the protection hole onto the base substrate, and a distance between a surface of the auxiliary connection structure away from the base substrate and the base substrate being less than a distance between a surface of the planarization layer away from the base substrate and the base substrate; and forming a light-emitting layer and a second electrode structure, the first electrode structure, the light-emitting layer and the second electrode structure forming a light-emitting unit, and the second electrode structure being electrically coupled to the auxiliary electrode.

In a possible embodiment of the present disclosure, the forming the protection hole includes forming the protection hole penetrating through the protection layer and the planarization layer so as to expose the surface of the auxiliary electrode away from the base substrate.

In a possible embodiment of the present disclosure, the forming the first electrode structure and the auxiliary connection structure through a single patterning process includes forming the auxiliary connection structure in a region corresponding to the protection hole, and the surface of the auxiliary electrode away from the base substrate is in contact with a surface of the auxiliary connection structure close to the base substrate.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Such words as "first" and "second" involved in the specification and the appended claims are merely used to differentiate different objects rather than to represent any specific order. In addition, such words as "include" or "including" or any other variations involved in the present disclosure intend to provide non-exclusive coverage, so that a procedure, method, system, product or device including a series of steps or units may also include any other elements not listed herein, or may include any inherent steps or units of the procedure, method, system, product or device. The expression "and/or" in the description and the appended claims is merely used to represent at least one of the objects before and after the expression. For example, "A and/or B and/or C" represents seven situations, i.e., there is only A, there is only B, there is only C, there are both A and B, there are both B and C, there are both A and C, and there are A, B and C.

The present disclosure provides in some embodiments a display substrate.

Figure 1:
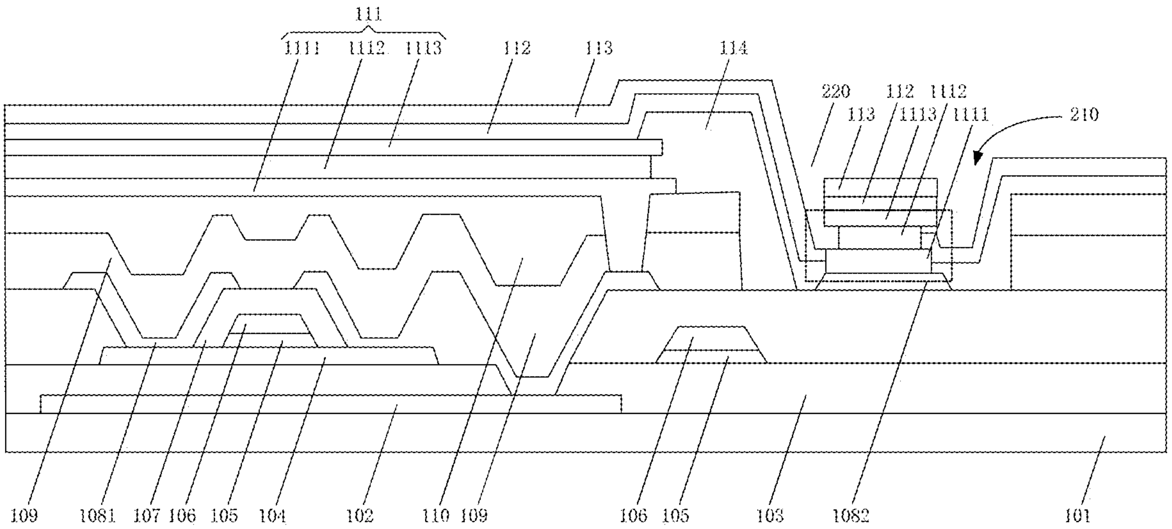
FIG. 1 is a schematic view of a display substrate according to one embodiment of the present disclosure.

As shown in FIG. 1, in the embodiments of the present disclosure, the display substrate includes a base substrate 101, a driving circuit layer formed on the base substrate 101, and a light-emitting unit arranged at a side of the driving circuit layer away from the base substrate 101.

As shown in FIG. 1, in a possible embodiment of the present disclosure, the driving circuit layer mainly includes a semiconductor layer 104, a gate insulation layer 105, a gate electrode layer 106, a dielectric layer 107 and a source/drain metal layer. In some embodiments of the present disclosure, depending on the practical needs, the display substrate also includes a light-shielding layer 102, a buffer layer 103 and the like. During the implementation, the structure of the display substrate may be adjusted adaptively according to the practical needs, i.e., the structure of the display substrate will not be particularly defined herein.

In some embodiments of the present disclosure, the driving circuit layer includes a source/drain metal layer which includes source/drain electrodes 1081.

More specifically, a part of the semiconductor layer 104 forms an active layer of the thin-film transistor, and another part of the semiconductor layer 104 is subjected to conductor-formation treatment and then coupled to the source/drain electrodes 1081 of a thin-film transistor. The gate electrode layer 106 forms a gate electrode, or a control electrode, of the thin-film transistor, and the gate electrode layer 106 also forms a gate line.

With reference to FIG. 1 again, the light-emitting unit includes a first electrode structure 111, a light-emitting layer 112, and a second electrode structure laminated one on another in a direction away from the base substrate 101.

The display substrate further includes a pixel definition layer 114 so as to define a range of a light-emitting region of each sub-pixel.

In a possible embodiment of the present disclosure, the first electrode structure 111 is an anode of the light-emitting unit and the second electrode structure 113 is a cathode of the light-emitting unit. The first electrode structure 111 is electrically coupled to the source/drain electrodes 1081.

The source/drain metal layer further includes an auxiliary electrode 1082 coupled to the second electrode structure 113 of the light-emitting unit, so as to reduce an IR drop.

A protection layer 109 and a planarization layer 110 are laminated one on another in a direction away from the base substrate 101 between the driving circuit layer and the light-emitting unit. The protection layer 109 is configured to protect each structure in the driving circuit layer, and the planarization layer 110 is configured to provide a relatively flat surface so as to improve the flatness of the first electrode structure 111.

With reference to FIG. 1 again, in some embodiments of the present disclosure, the display substrate further includes an auxiliary connection structure 220 arranged at a same layer, and made of a same material, as the first electrode structure 111.

The auxiliary connection structure 220 has a pointed structure and is electrically coupled to the auxiliary electrode 1082 through a via hole.

After the formation of the first electrode structure 111, the light-emitting layer 112 is deposited. At this time, the light-emitting layer 112 is interrupted and a part of the auxiliary connection structure 220 is exposed. During the formation of the second electrode structure 113, the second electrode structure 113 is lapped onto the exposed auxiliary connection structure 220, so as to enable the auxiliary electrode 1082 to be electrically coupled to the second electrode structure 113, thereby to reduce the IR drop.

Figure 2A:
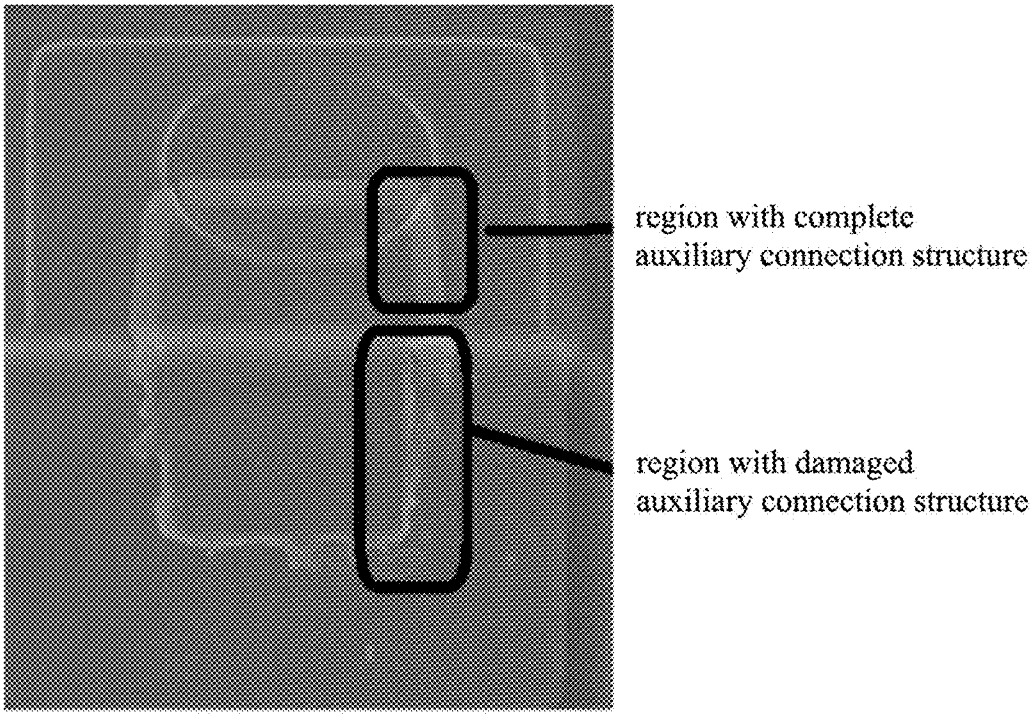
FIG. 2A is an electron microscopic scanning graph of an auxiliary connection structure of a conventional display substrate.

As shown in FIG. 2A, it should be appreciated that, prior to forming the pixel definition layer 114 and the light-emitting layer 112, usually a step of washing the display substrate with a brush is performed. However, during the washing, the auxiliary connection structure 220 is easily damaged, and thereby it is impossible to interrupt the light-emitting layer 112 through the auxiliary connection structure 220.

Figure 2B:
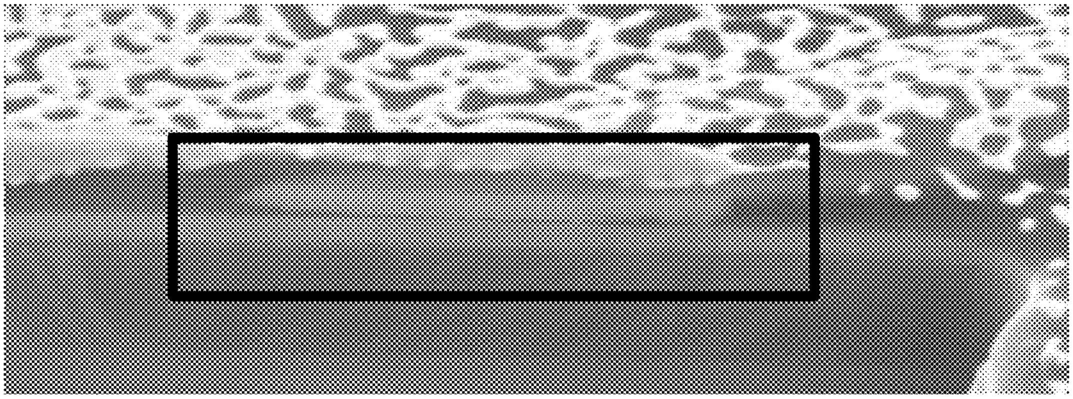
FIG. 2B is another electron microscopic scanning graph of the auxiliary connection structure of the conventional display substrate.

As shown in FIG. 2B, debris of the damaged auxiliary connection structure 220 may penetrate through the subsequently-formed light-emitting layer 112. In this way, a short circuit occurs between the first electrode structure 111 and the second electrode structure 113 and thereby such defects as local dark points occur. Hence, a display effect will be adversely affected.

As shown in FIG. 1, in the embodiments of the present disclosure, a protection hole 210 is further formed in the planarization layer 110 at a side away from the base substrate 101 in such a manner as to penetrate through at least a part of the planarization layer 110.

In a possible embodiment of the present disclosure, the protection hole 210 is a blind hole formed in the planarization layer 110, i.e., the protection hole 210 does not extend completely through the planarization layer 110, and a depth of the protection hole 210 is less than a thickness of the planarization layer 110. It should be appreciated that, in the embodiments of the present disclosure, a thickness of a structure refers to a dimension of the structure in a direction perpendicular to a surface of the base substrate 101.

Figure 3:
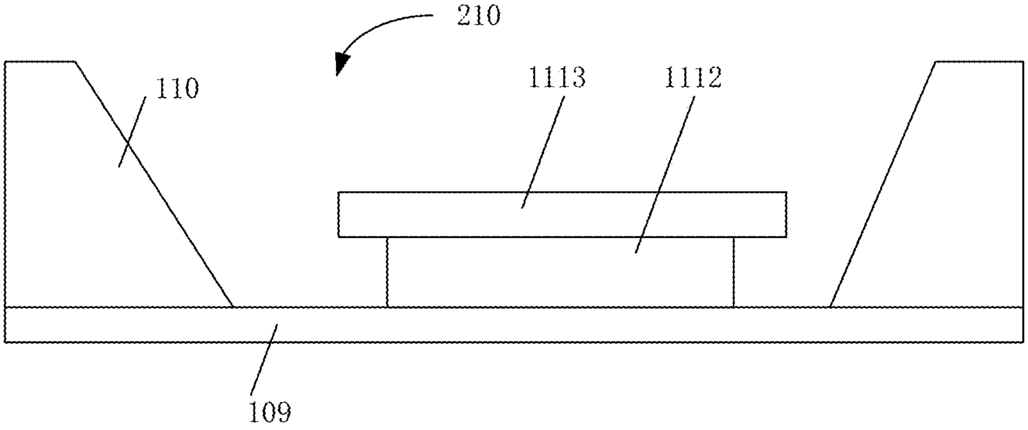
FIG. 3 is another schematic view of the display substrate according to one embodiment of the present disclosure.
Figure 4:
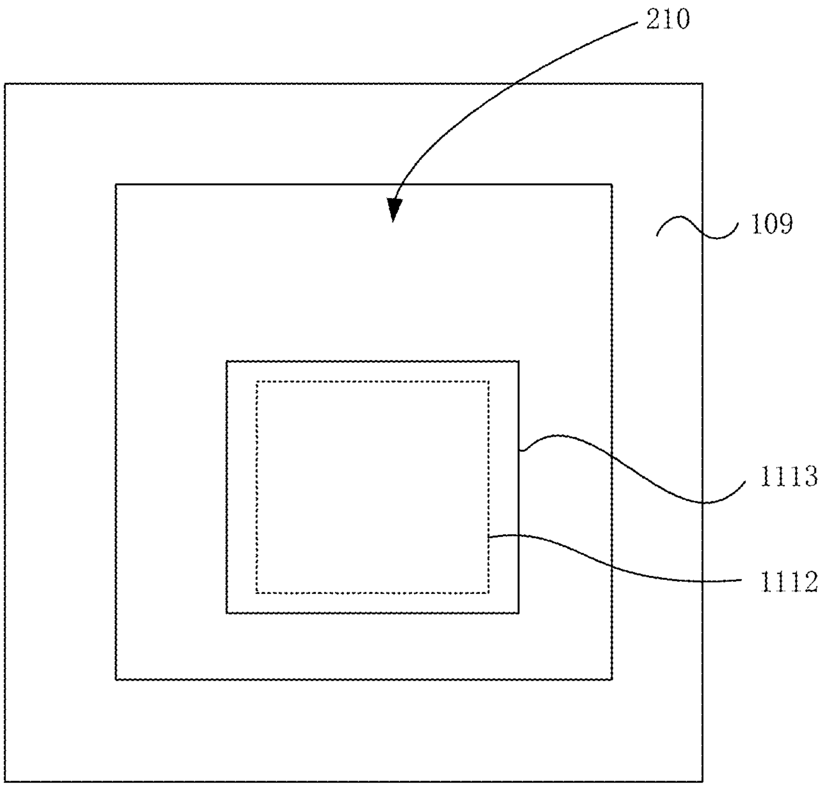
FIG. 4 is a top view of the display substrate in FIG. 3.

As shown in FIGS. 3 and 4, in another possible embodiment of the present disclosure, the protection hole 210 is a through hole formed in the planarization layer 110, i.e., the protection hole 210 completely penetrates through the planarization layer 110 so as to expose the protection layer 109 therebelow.

The protection hole 210 is formed so as to protect the auxiliary connection structure. An orthogonal projection of the auxiliary connection structure 220 onto the base substrate 101 is located within an orthogonal projection of the protection hole 210 onto the base substrate 101. In a possible embodiment of the present disclosure, a size of the protection hole 210 is 40 nm*40 nm. Obviously, during the implementation, the size of the protection hole 210 may be adjusted according to the practical needs.

Further, a distance between a surface of the auxiliary connection structure 220 away from the base substrate 101 and the base substrate 101 is smaller than a distance between the surface of the planarization layer 110 away from the base substrate 101 and the base substrate 101.

As shown in FIG. 1, FIG. 3 and FIG. 4, the auxiliary connection structure 220 is received in the protection hole 210, and an end of the auxiliary connection structure 220 away from the base substrate 101 does not protrude from a surface of the planarization layer 110. In this way, during the washing, it is able to prevent the brush from being in contact with the auxiliary connection structure 220, and prevent the auxiliary connection structure 220 from being damaged, thereby to improve the reliability of the display substrate.

In some embodiments of the present disclosure, the distance between the surface of the auxiliary connection structure 220 away from the base substrate 101 and the base substrate 101 is less than the distance between the surface of the planarization layer 110 away from the base substrate 101 and the base substrate 101, so as to prevent the auxiliary connection structure 220 from being damaged by the brush during the washing. Further, in some embodiments of the present disclosure, the distance between the surface of the auxiliary connection structure 220 away from the base substrate 101 and the surface of the planarization layer 110 away from the base substrate 101 is greater than a half of a thickness of the planarization layer 110.

In some embodiments of the present disclosure, a thickness of the auxiliary connection structure 220 is less than the thickness of the planarization layer 110 in a direction perpendicular to the base substrate 101. In some embodiments of the present disclosure, the planarization layer 110 has a thickness greater than 1000 nm, e.g., greater than 2000 nm, and the auxiliary connection structure 220 has a thickness less than 1000 nm. More specifically, the planarization layer 110 has a thickness greater than 2100 nm so as to improve the flatness. The auxiliary connection structure 220 has a thickness of from 600 nm to 800 nm, and a distance between the surface of the auxiliary connection structure 220 away from the base substrate 101 and the surface of the planarization layer 110 away from the base substrate 101 is greater than 1400 nm.

As shown in FIG. 3, in a possible embodiment of the present disclosure, the protection layer 109 has a thickness of about 450 nm, the planarization layer 110 has a thickness of about 2200 nm, and the auxiliary connection structure 220 has a thickness of about 700 nm. In this way, the distance between the surface of the auxiliary connection structure 220 away from the base substrate 101 and the surface of the planarization layer 110 away from the base substrate 101 is about 1500 nm, so as to protect the auxiliary connection structure 220 in a better manner.

In the embodiments of the present disclosure, through controlling the distance between the surface of the auxiliary connection structure 220 away from the base substrate 101 and the surface of the planarization layer 110 away from the base substrate 101, it is able to protect the auxiliary connection structure 220 in a better manner, and prevent the auxiliary connection structure 220 from being damaged.

In some embodiments of the present disclosure, the distance between the surface of the auxiliary connection structure 220 away from the base substrate 101 and the base substrate 101 is smaller than a distance between the base substrate 101 and a surface of the second electrode structure 113 in the light-emitting region of the display substrate close to the base substrate 101. In this way, it is able for the second electrode structure 113 to be lapped onto the auxiliary connection structure 220, thereby to improve the reliability of the display substrate.

As shown in FIG. 1, in some embodiments of the present disclosure, the auxiliary connection structure 220 includes a first sub-electrode layer 1111, a reflection sub-layer 1112, and a second sub-electrode layer 1113 laminated one on another in a direction away from the base substrate 101. An orthogonal projection of the first sub-electrode layer 1111 onto the base substrate 101 is greater than an orthogonal projection of the reflection sub-layer 1112 onto the base substrate 101, and an orthogonal projection of the second sub-electrode layer 1113 onto the base substrate 101 is greater than an orthogonal projection of the reflection sub-layer 1112 onto the base substrate 101.

It should be appreciated that, the auxiliary connection structure 220 is approximately of an I-like shape, i.e., each end has a larger size and a middle portion has a smaller size, so as to interrupt the light-emitting layer 112 effectively.

In some embodiments of the present disclosure, each of the first sub-electrode layer 1111 and the second sub-electrode layer 1113 is made of a transparent conductive material, e.g., indium tin oxide (ITO). A reflection sub-layer 1112 is further arranged between the first sub-electrode layer 1111 and the second sub-electrode layer 1113. The reflection sub-layer 1112 is made of metal, e.g., copper (Cu), molybdenum (Mo) or niobium (Nb), so as to help improve the display effect.

In a possible embodiment of the present disclosure, in the case that protection hole 210 extends through planarization layer 110, it also extends through at least a part of the protection layer 109.

Specifically, in some embodiments of the present disclosure, the protection hole 210 penetrates through only a part of the protection layer 109. At this time, in order to enable the auxiliary connection structure 220 to be electrically coupled to the auxiliary electrode 1082, the auxiliary connection structure 220 is electrically coupled to the auxiliary electrode 1082 through a via hole.

As shown in FIG. 1, in some embodiments of the present disclosure, the protection hole 210 extends through the planarization layer 110 and the protection layer 109, and the orthogonal projection of the protection hole 210 onto the base substrate 101 covers the orthogonal projection of the auxiliary electrode 1082 onto the base substrate 101. In the case that the protection hole 210 penetrates through the planarization layer 110 and the protection layer 109, the surface of the auxiliary electrode 1082 away from the base substrate 101 is completely exposed. At this time, a lower surface of the auxiliary connection structure 220 is in direct contact with an upper surface of the auxiliary electrode 1082, so as to enable the auxiliary electrode 1082 to be electrically coupled to the auxiliary connection structure 220, and provide a larger distance between an upper surface of the auxiliary connection structure 220 and the upper surface of the planarization layer 110, thereby to further prevent the auxiliary connection structure 220 from being damaged.

A first distance difference of the display substrate is greater than a thickness of a suspension part of the auxiliary connection structure 220. In the embodiments of the present disclosure, the first distance difference refers to a difference between the distance between the surface of the auxiliary connection structure 220 away from the base substrate 101 and the base substrate 101 and a distance between the surface of the first electrode structure 111 away from the base substrate 101 and the base substrate 101, i.e., a distance between an upper surface of the auxiliary connection structure 220 and an upper surface of the first electrode structure 111.

The suspension part of the auxiliary connection structure 220 includes the second sub-electrode layer 1113. The reflection sub-layer 1112 is retracted laterally due to the over-etching of the reflection sub-layer 1112, so an orthogonal projection of the second sub-electrode layer 1113 onto the base substrate 101 is greater than an orthogonal projection of the reflection sub-layer 1112 onto the base substrate 101. As shown in FIG. 1, a part of the auxiliary connection structure 220 is in a suspending state.

Further, in some embodiments of the present disclosure, the thickness of the suspension part is greater than a thickness of the second electrode structure 113 in a direction perpendicular to the base substrate 101.

Through controlling the thickness of the suspension part, it is able to ensure the strength of the suspension part and prevent the auxiliary connection structure 220 from being damaged, thereby to improve the reliability of the connection between the second electrode structure 113 and the auxiliary electrode 1082.

Here, an upper surface of a structure refers to a surface away from the base substrate 101, and a lower surface of the structure refers to a surface close to the base substrate 101.

The present disclosure further provides in some embodiments a display device including the above-mentioned display substrate.

The implementation of the display device may refer to that of the display substrate with a same technical effect, which will not be particularly defined herein.

The present disclosure further provides in some embodiments a method for manufacturing a display substrate.

Figure 5:
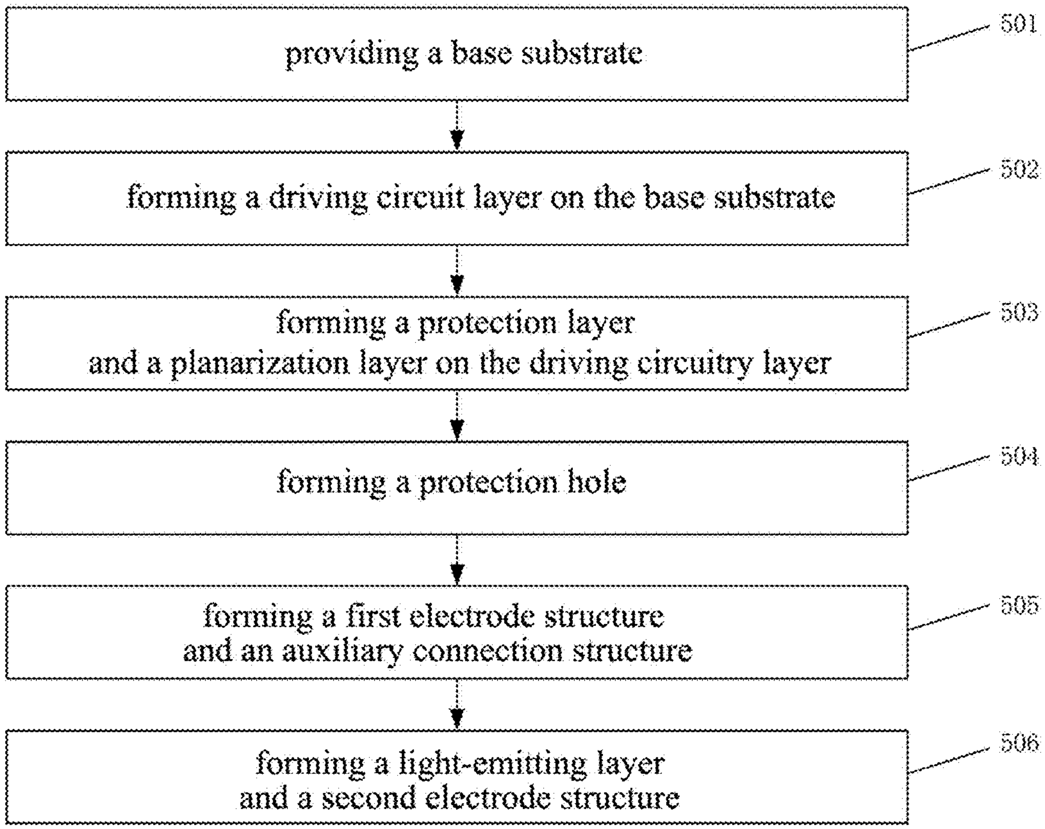
FIG. 5 is a flow chart of a method for manufacturing the display substrate according to one embodiment of the present disclosure.

As shown in FIG. 5, in the embodiments of the present disclosure, the method includes the following steps.

Step 501: providing a base substrate.

Step 502: forming a driving circuit layer on the base substrate. The driving circuit layer includes a source/drain metal layer, and the source/drain metal layer includes a source electrode, a drain electrode and an auxiliary electrode.

Step 503: forming a protection layer and a planarization layer in sequence on the driving circuit layer.

In the embodiments of the present disclosure, a light-shielding layer, a buffer layer, a semiconductor layer, a gate insulation layer and a gate electrode layer are successively formed on the base substrate, and then the semiconductor layer is subjected to conductor-formation treatment through a self-aligned conductor-formation process using a photoresist on the gate electrode layer, so as to form a channel region and a conduction region.

Next, a dielectric layer is formed and a via hole is formed in the dielectric layer. Next, the source/drain metal layer is formed through a patterning process, so as to form a source electrode, a drain electrode, a power source line pattern, an auxiliary electrode and a sensor pattern. Finally, the protection layer and the planarization layer are deposited.

It should be appreciated that, the step of forming the planarization layer, the steps before the formation of the planarization layer and the materials thereof are known in the art, and thus will not be particularly defined herein.

Step 504: forming a protection hole in the planarization layer at a side away from the base substrate. The protection hole penetrates through at least a part of the planarization layer:

Next, the protection hole is formed. As mentioned hereinabove, the protection hole may be a blind hole formed in planarization layer. The protection hole may also be a through hole penetrating through the planarization layer. In the case that the protection hole penetrates through the planarization layer, the protection hole may penetrate through only the planarization layer without extending into the protection layer. In addition, the protection hole may also extend into a part of the protection layer.

In some embodiments of the present disclosure, Step 504 includes forming the protection hole penetrating through the protection layer and the planarization layer so as to expose a surface of the auxiliary electrode away from the base substrate.

In the embodiments of the present disclosure, the protection hole may also extend through both the planarization layer and the protection layer so as to expose the auxiliary electrode.

Step 505: forming a first electrode structure and an auxiliary connection structure through a single patterning process.

The first electrode structure and the auxiliary connection structure may refer to those mentioned hereinabove.

The auxiliary connection structure is arranged in a region where the protection hole is formed. In this way, a height of the auxiliary connection structure is smaller than a height of the planarization layer.

In some embodiments of the present disclosure, in the case that the protection hole extends through the protection layer and the planarization layer, Step 505 includes forming the auxiliary connection structure in a region corresponding to the protection hole. A surface of the auxiliary electrode away from the base substrate is in contact with a surface of the auxiliary connection structure close to the base substrate.

In the embodiments of the present disclosure, when the protection hole penetrates through the protection layer and the planarization layer, the surface of the auxiliary electrode away from the base substrate is exposed. At this time, the surface of the auxiliary connection structure close to the base substrate is in direct contact with the auxiliary electrode, so as to enable the auxiliary connection structure to be electrically coupled to the auxiliary electrode.

In other cases, i.e., in the case that the protection hole does not penetrate through the protection layer and the planarization layer at the same time, a via hole needs to be formed in the planarization layer and/or the protection layer, so as to enable the auxiliary connection structure to be electrically coupled to the auxiliary electrode through the via hole.

In some embodiments of the present disclosure, the auxiliary connection structure includes a first sub-electrode layer, a reflection sub-layer and a second sub-electrode layer laminated one on another in a direction away from the base substrate.

Step 505 includes: forming the first sub-electrode layer: forming the reflection sub-layer at a side of the first sub-electrode layer away from the base substrate: forming the second sub-electrode layer at a side of the reflection sub-layer away from the base substrate; and etching the reflection sub-layer such that an orthogonal projection of the second sub-electrode layer onto the base substrate is greater than an orthogonal projection of the reflection sub-layer onto the base substrate.

In the embodiments of the present disclosure, the first sub-electrode layer, the reflection sub-layer and the second sub-electrode layer are deposited and then patterned. Specifically, the second sub-electrode layer is etched at first, and then the reflection sub-layer is over-etched, so that the reflection sub-layer is retracted laterally. In this way, the orthogonal projection of the second sub-electrode layer onto the base substrate is greater than the orthogonal projection of the reflection sub-layer onto the base substrate, and the auxiliary connection structure is of an I-like shape.

The reflection sub-layer is made of a material different from the first sub-electrode layer and the second sub-electrode layer, so the other structure may not be adversely affected by the etching.

During the implementation, an etchant may be selected according to the practical needs. For example, when the second sub-electrode layer is to be etched, dilute sulphuric acid at a relatively small concentration may be selected, so as to prevent the reflection sub-layer made of copper from being adversely affected. When the reflection sub-layer is to be etched, phosphoric acid at a relatively large concentration may be selected so as to over-etch the reflection sub-layer and enable the reflection sub-layer to be retracted laterally to a greater extent. Here, the word "laterally" refers to a direction parallel to the base substrate.

Step 506: forming a light-emitting layer and a second electrode structure. The first electrode structure, the light-emitting layer and the second electrode structure form a light-emitting unit, and the second electrode structure is electrically coupled to the auxiliary electrode.

Finally, the light-emitting layer and the second electrode structure are formed. During the formation of the light-emitting layer, the light-emitting layer is interrupted at a position corresponding to the auxiliary connection structure due to a pointed structure of the auxiliary connection structure, so as to expose the auxiliary connection structure. During the formation of the second electrode structure, the second electrode structure is lapped onto the exposed auxiliary connection structure. In this way, it is able for the second electrode structure to be electrically coupled to the auxiliary electrode, thereby to reduce the IR drop and improve the display effect.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, a driving circuit layer arranged on the base substrate, and a light-emitting unit arranged at a side of the driving circuit layer away from the base substrate, wherein the driving circuit layer comprises a source/drain metal layer, the source/drain metal layer comprises a source electrode, a drain electrode and an auxiliary electrode, the light-emitting unit comprises a first electrode structure, a light-emitting layer and a second electrode structure laminated one on another in a direction away from the base substrate, the first electrode structure is electrically coupled to the source electrode and the drain electrode, the second electrode structure is electrically coupled to the auxiliary electrode, and the display substrate further comprises an auxiliary connection structure arranged at a same layer, and made of a same material, as the first electrode structure, wherein a protection layer and a planarization layer are laminated one on another in a direction away from the base substrate between the driving circuit layer and the light-emitting unit, the display substrate further comprises a protection hole formed in the planarization layer at a side away from the base substrate and penetrating through at least a part of the planarization layer, an orthogonal projection of the auxiliary connection structure onto the base substrate is located within an orthogonal projection of the protection hole onto the base substrate, and a distance between a surface of the auxiliary connection structure away from the base substrate and the base substrate is less than a distance between a surface of the planarization layer away from the base substrate and the base substrate;

the auxiliary connection structure comprises a first sub-electrode layer, a reflection sub-layer and a second sub-electrode layer laminated one on another in a direction away from the base substrate, an orthogonal projection of the first sub-electrode layer onto the base substrate is greater than an orthogonal projection of the reflection sub-layer onto the base substrate, and an orthogonal projection of the second sub-electrode layer onto the base substrate is greater than the orthogonal projection of the reflection sub-layer onto the base substrate.

2. The display substrate according to claim 1, wherein a distance between the surface of the auxiliary connection structure away from the base substrate and the surface of the planarization layer away from the base substrate is greater than a half of a thickness of the planarization layer.

3. The display substrate according to claim 2, wherein in a direction perpendicular to the base substrate, a thickness of the auxiliary connection structure is less than the thickness of the planarization layer.

4. The display substrate according to claim 3, wherein the planarization layer has a thickness greater than 2100 nm, the auxiliary connection structure has a thickness of 600 nm to 800 nm, and the distance between the surface of the auxiliary connection structure away from the base substrate and the surface of the planarization layer away from the base substrate is greater than 1400 nm.

5. The display substrate according to claim 1, wherein the distance between the surface of the auxiliary connection structure away from the base substrate and the base substrate is smaller than a distance between the base substrate and a surface of the second electrode structure in a light-emitting region of the display substrate close to the base substrate.

6. The display substrate according to claim 1, wherein the protection hole extends through the planarization layer and the protection layer, and an orthogonal projection of the protection hole onto the base substrate covers an orthogonal projection of the auxiliary electrode onto the base substrate.

7. The display substrate according to claim 6, wherein a surface of the auxiliary electrode away from the base substrate is in contact with a surface of the auxiliary connection structure close to the base substrate.

8. The display substrate according to claim 1, wherein a first distance difference of the display substrate is greater than a thickness of a suspension part of the auxiliary connection structure, the first distance difference is a difference between the distance between the surface of the auxiliary connection structure away from the base substrate and the base substrate and a distance between a surface of the first electrode structure away from the base substrate and the base substrate, and the suspension part of the auxiliary connection structure comprises the second sub-electrode layer.

9. The display substrate according to claim 8, wherein the suspension part has a thickness greater than that of the second electrode structure in a direction perpendicular to the base substrate.

10. A display device, comprising the display substrate according to claim 1.

11. A method for manufacturing a display substrate, comprising:

providing a base substrate;

forming a driving circuit layer on the base substrate, the driving circuit layer comprising a source/drain metal layer, and the source/drain metal layer comprising a source electrode, a drain electrode and an auxiliary electrode;

forming a protection layer and a planarization layer in sequence on the driving circuit layer;

forming a protection hole in the planarization layer at a side away from the base substrate, the protection hole penetrating through at least part of the planarization layer;

forming a first electrode structure and an auxiliary connection structure through a single patterning process, the first electrode structure being electrically coupled to the source electrode and the drain electrode, an orthogonal projection of the auxiliary connection structure onto the base substrate being located within an orthogonal projection of the protection hole onto the base substrate, and a distance between a surface of the auxiliary connection structure away from the base substrate and the base substrate being less than a distance between a surface of the planarization layer away from the base substrate and the base substrate; the auxiliary connection structure comprising a first sub-electrode layer, a reflection sub-layer and a second sub-electrode layer laminated one on another in a direction away from the base substrate, an orthogonal projection of the first sub-electrode layer onto the base substrate being greater than an orthogonal projection of the reflection sub-layer onto the base substrate, and an orthogonal projection of the second sub-electrode layer onto the base substrate being greater than the orthogonal projection of the reflection sub-layer onto the base substrate; and forming a light-emitting layer and a second electrode structure, the first electrode structure, the light-emitting layer and the second electrode structure forming a light-emitting unit, and the second electrode structure being electrically coupled to the auxiliary electrode.

12. The method according to claim 11, wherein the forming the protection hole comprises forming the protection hole penetrating through the protection layer and the planarization layer so as to expose a surface of the auxiliary electrode away from the base substrate.

13. The method according to claim 12, wherein the forming the first electrode structure and the auxiliary connection structure through a single patterning process comprises forming the auxiliary connection structure in a region corresponding to the protection hole, and the surface of the auxiliary electrode away from the base substrate is in contact with a surface of the auxiliary connection structure close to the base substrate.

* * * * *